(12) United States Patent  
Ishibashi et al.

(10) Patent No.: US 7,828,927 B2
(45) Date of Patent: Nov. 9, 2010

(54) PLASMA PROCESSING DEVICE

(75) Inventors: Kiyotaka Ishibashi, Amagasaki (JP);
Toshihisa Nozawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 271 days.

(21) Appl. No.: 11/060,558

(22) Filed: Feb. 18, 2005

(65) Prior Publication Data

US 2005/0139322 A1    Jun. 30, 2005

Related U.S. Application Data

(63) Continuation of application No. PCT/JP03/10391, filed on Aug. 15, 2003.

(30) Foreign Application Priority Data

Aug. 20, 2002    (JP) .............................. 2002-239030

(51) Int. Cl.
*C23C 16/00* (2006.01)
*C23F 1/00* (2006.01)
*H01L 21/306* (2006.01)

(52) U.S. Cl. .................. 156/345.41; 156/345.42; 156/345.46; 156/345.48; 156/345.49; 118/723 MW; 118/723 ME; 118/723 MR; 118/723 MA; 118/723 AN

(58) Field of Classification Search ......... 118/723 MW; 156/345.36, 345.41, 345.42, 345.46, 345.49
See application file for complete search history.

(56) References Cited

U.S. PATENT DOCUMENTS 5,234,526 A *   8/1993  Chen et al. ............. 156/345.42

6,091,045 A *   7/2000  Mabuchi et al. ........ 219/121.43
6,607,633 B2*   8/2003  Noguchi ................. 156/345.41
2001/0036465 A1* 11/2001 Ishll et al. .................... 424/400
2002/0076367 A1*  6/2002 Hongoh et al. .............. 422/186

FOREIGN PATENT DOCUMENTS

EP    1 315 201 A1    5/2003
JP    06-120155    *    4/1994
JP    2002-50613        2/2002

OTHER PUBLICATIONS

JP_Eng_06-120155, Katsuo (dt. Apr. 28, 1994).*

* cited by examiner

*Primary Examiner*—Parviz Hassanzadeh
*Assistant Examiner*—Rakesh Dhingra
(74) *Attorney, Agent, or Firm*—Oblon, Spivak, McClelland, Maier & Neustadt, L.L.P.

(57) ABSTRACT

A plasma processing device comprising a chamber (1) for accommodating therein a substrate (11), a high-frequency power supply (5) for generating microwave, and an antenna unit (3) for radiating microwave into the chamber (1). Microwave generated in the power supply (5) is sent to the antenna unit (3) via a waveguide (6). A top plate (4) forming part of a partition wall of the chamber (1) is formed at the upper portion of the chamber (1). A specified annular delay pass unit (2) formed of the same material as that of the top plate (4), for delaying the propagation of microwave, is provided on the outer peripheral portion of the top plate (4). Accordingly, the plasma processing device can restrict an abnormal discharge and the production of the foreign matters.

13 Claims, 14 Drawing Sheets

| CONFIGURATION | L | D | LEAKAGE RATIO (%) | EFFECT |
|---|---|---|---|---|
| A (FIG.7) | $\lambda/4$ | — | 43.9% | A LITTLE EFFECTIVE |
| B (FIG.8) | $\lambda/4$ | $\lambda/4$ | 16.6% | RELATIVELY EFFECTIVE |
| C (FIG.9) | $\lambda/4$ | $\lambda/4 + 5mm$ | 16.7% | RELATIVELY EFFECTIVE |
| D (FIG.10) | $\lambda/4$ | $\lambda/2$ | 36.7% | A LITTLE EFFECTIVE |
| E (FIG.11) | $\lambda/4$ | $\lambda/4$ | 5.9% | MOST EFFECTIVE |
| Z1 (FIG.12) | — | — | 98.1% | REFERENCE |
| Z2 (FIG.13) | $\lambda/2$ | $\lambda/4$ | 98.6% | NO EFFECT |

FIG.20

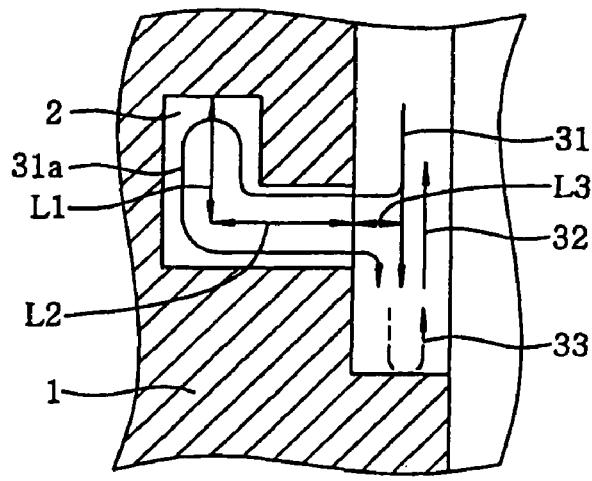

FIG.21

| CONFIGURATION | CONDITION OF LENGTH |
|---|---|
| F (FIG.15) | $L1+L2=\dfrac{\lambda}{4}$ |
| G (FIG.16) | $L1=\dfrac{\lambda}{4}$, $D=\dfrac{\lambda}{4}$ |
| H (FIG.17) | $L1=\dfrac{\lambda}{4}$, $D=\dfrac{\lambda}{4}$ OR $\dfrac{3}{4}\lambda$ |
| I (FIG.18) | $L1=\dfrac{\lambda}{4}$, $D=\dfrac{\lambda}{4}$ OR $\dfrac{3}{4}\lambda$ |
| J (FIG.19) | $L1=\dfrac{\lambda}{4}$, $D$ |
| K (FIG.20) | $\dfrac{L1+L2}{\lambda_1}+\dfrac{L3}{\lambda_2}=\dfrac{1}{4}$ <br> ($\lambda_1=\lambda_0/\sqrt{\varepsilon r_B}$, $\lambda_2=\lambda_0/\sqrt{\varepsilon r_A}$) |

PLASMA PROCESSING DEVICE

This application is a Continuation Application of PCT International Application No. PCT/JP2003/010391 filed on Aug. 15, 2003, which designated the United States.

FIELD OF THE INVENTION

The present invention relates to a plasma processing device; and more particularly, to a plasma processing device for performing a predetermined process on a substrate in a plasma generation region formed by introducing a microwave in a chamber.

BACKGROUND OF THE INVENTION

To realize the recent trend of a high density and a high miniaturization of semiconductor devices, a plasma processing device is used for performing a film forming process, an etching process, an ashing process and the like in a manufacturing process of the semiconductor devices. Especially, in a microwave plasma processing device which generates a plasma by using a microwave, the plasma can be stably generated under a condition of a pressure ranging from a low pressure of about 1~300 Pa (high vacuum) to an even comparatively high pressure. For the reason, a microwave plasma processing device using a microwave of, e.g., 2.45 GHz has attracted much attention.

Hereinafter, such a conventional plasma processing device will be described. As shown in FIG. 22, the plasma processing device includes a chamber 101 for accommodating therein a substrate 111 and performing a predetermined process thereon; a high frequency power supply 105 for generating a microwave; and an antenna unit 103 for radiating the microwave into the chamber 101.

The antenna unit 103 is constructed to have a slot plate 103c, a wave delay plate 103b and an antenna cover 103a. Provided in the slot plate 103c is a plurality of slots (openings) through which the microwave is radiated into the chamber 101. The microwave generated by the high frequency power supply 105 is propagated through a waveguide 106 to the antenna unit 103.

Provided at an upper portion of the chamber 101 is a top plate 104 constituting a part of a partition wall of the chamber 101. The top plate 104 is formed of, e.g., a dielectric material such as quartz. Between the top plate 104 and the partition wall of the chamber 101, a sealing member 114 such as, e.g., an O-ring is installed. The antenna unit 103 is disposed above the top plate 104.

In the chamber 101, a susceptor 107 for holding the substrate 111 accommodated in the chamber 101 is installed. Further, a vacuum pump 109 for evacuating the chamber 101 is connected to the chamber 101.

In the above-mentioned plasma processing device, the chamber 101 is evacuated by the vacuum pump 109 and, e.g., an argon gas is introduced into the chamber 101 as a gas for generating a plasma whose pressure falls within a predetermined range of pressure.

The microwave generated by the high frequency power source 105 is propagated through the waveguide 106 to the antenna unit 103. As shown in FIG. 23, the microwave that has reached the antenna unit 103 propagates through the wave delay plate 103b as indicated by arrows and is radiated through the slot plate 103c into the chamber 101 to generate an electromagnetic field.

Due to the electromagnetic field generated in the chamber 101, the argon gas is dissociated and a plasma generation region 122 is formed between the substrate 111 and the top plate 104 so that a predetermined plasma processing is performed on the substrate 111.

In the plasma generation region 122 formed in the chamber 101, to maintain the plasma generation region 122 electrically neutral, electrons and ions (charged particles) in the plasma generation region 122 are made to vibrate at a certain plasma frequency. The plasma frequency increases as the density of the charged particles becomes higher and the mass of the charged particles becomes lighter.

Accordingly, in the plasma generation region 122, the plasma frequency of electrons having a mass substantially smaller than that of ions is considerably higher than the plasma frequency of the ions and falls in a microwave range. At this time, in case the frequency of the microwave generated by the high frequency power source 105 is greater than the plasma frequency, the microwave can propagate through the plasma generation region 122 so that it is possible to supply the microwave to the plasma generation region 122.

Meanwhile, the plasma frequency of the electrons increases as the density of the electrons becomes higher; and if the plasma frequency becomes higher than that of the microwave generated by the high frequency power source 105, i.e., if a cutoff frequency in the plasma generation region 122 becomes higher than the frequency of the microwave, there occurs a phenomenon that the electric field of the microwave is blocked at the periphery of the plasma generation region 122. That is, the microwave is reflected by the plasma generation region 122. As the electron density becomes higher, such phenomenon prominently occurs.

As illustrated in FIG. 23, a part of the microwave reflected by the plasma generation region 122 propagates through the top plate 104. As a result, a strong electric field is generated at a location 130 adjacent to an outer peripheral portion of the top plate 104 wherein the top plate 104 contacts with the chamber 101, thereby resulting in an abnormal discharge and a production of foreign materials.

SUMMARY OF THE INVENTION

The present invention has been developed in order to solve the aforementioned drawbacks. Therefore, an object of the present invention is to provide a plasma processing device which suppresses the occurrence of an abnormal discharge and the production of foreign materials.

In accordance with the present invention, there is provided a plasma processing device for performing a predetermined process on a substrate by subjecting the substrate to be exposed to a plasma generation region, the apparatus includes a chamber, a top plate and an antenna unit. The chamber accommodates therein the substrate. The top plate is a part of a partition wall of the chamber. The antenna unit supplies a high frequency electromagnetic field through the top plate into the chamber to form the plasma generation region between the top plate and the substrate accommodated in the chamber. A delay pass unit branches the high frequency electromagnetic field propagating through the top plate, and when the branched high frequency electromagnetic field joins again with the high frequency electromagnetic field that propagates through the top plate without being branched, the delay pass unit shifts a phase of the branched high frequency electromagnetic field by an odd times of $\lambda/2$ relative to that of the high frequency electromagnetic field that propagates through the top plate without being branched, where $\lambda$ is a wavelength of the high frequency electromagnetic field propagating through the top plate.

According to the above-described structure, the phase of the high frequency electromagnetic field branched by the delay pass unit is shifted by an odd times of $\lambda/2$ relative to that of the high frequency electromagnetic field propagating through the top plate without being branched so that the branched high frequency electromagnetic field and the non-branched high frequency electromagnetic field propagating through the top plate counteract each other. Therefore, most of the electromagnetic field is reflected and propagates through the top plate in a direction opposite to the original propagating direction of the high frequency electromagnetic field in the top plate. In this way, components of the high frequency electromagnetic field propagating through the top plate toward an end thereof beyond the location of the delay pass unit are significantly decreased. As a result, a strong electric field is prevented from being generated at a location near the end of the top plate so that the occurrence of an abnormal discharge and the production of foreign materials are suppressed, thereby making it possible to stably perform the plasma processing on the substrate. Further, $\lambda/2$ is understood to include an error of about $\lambda/10$.

In addition, it is preferable that the top plate includes a flat plate portion disposed to face the substrate accommodated and a cylindrical shaped side wall portion extending from a peripheral portion of the flat plate portion toward the side of the substrate disposed, and that the delay pass unit is disposed on the side of the side wall portion.

In this case, a strong electric field is prevented from being generated at the end of the side wall portion. Specifically, it is preferable that the delay pass unit is disposed in a ring shape along an outer peripheral surface of the side wall portion.

In this case, it is possible to surely branch a part of the high frequency electromagnetic field propagating through the side wall portion to counteract the high frequency electromagnetic field that is not branched.

Further, it is preferable that the delay pass unit includes a first and a second portion located at an upstream and a downstream side, respectively, in terms of a forward direction of the high frequency electromagnetic field propagating through the top plate.

In this case, the high frequency electromagnetic field propagating beyond the first portion is reflected by the second portion so that it is possible to surely prevent generation of a strong electric field at the end of the top plate.

As a specific structure of such delay pass unit, it is preferable that the delay pass unit has a propagation area, communicating with the top plate, for propagating the branched high frequency electromagnetic field.

Further, as the propagation area, the delay pass unit has a portion through which the branched high frequency electromagnetic field propagates approximately parallel to the high frequency electromagnetic field propagating through the top plate without being branched.

Moreover, it is preferable that the propagation area is filled with a member having a predetermined dielectric constant.

In this case, the size of the propagation area can be made smaller than that for a case the propagation area is formed of a space (atmosphere).

In addition, it is preferable that the plasma processing device includes an electric wave absorber for absorbing the high frequency electromagnetic field, the electric wave absorber being disposed on the side far from the antenna unit with respect to the delay pass unit.

In this case, the high frequency electromagnetic field propagating further in a downstream direction from the delay pass unit is absorbed by the electric wave absorber, thereby more positively preventing generation of a strong electric field at the end of the top plate.

BRIEF DESCRIPTION OF THE DRAWINGS

FIG. 20 sets forth a partially enlarged cross sectional view of an eleventh example of the delay pass unit in the second preferred embodiment;

FIG. 21 indicates a dimensional relationship of the delay pass unit shown in FIGS. 15 to 20 in the second preferred embodiment;

DETAILED DESCRIPTION OF THE PREFERRED EMBODIMENTS

First Embodiment

Figure 1:
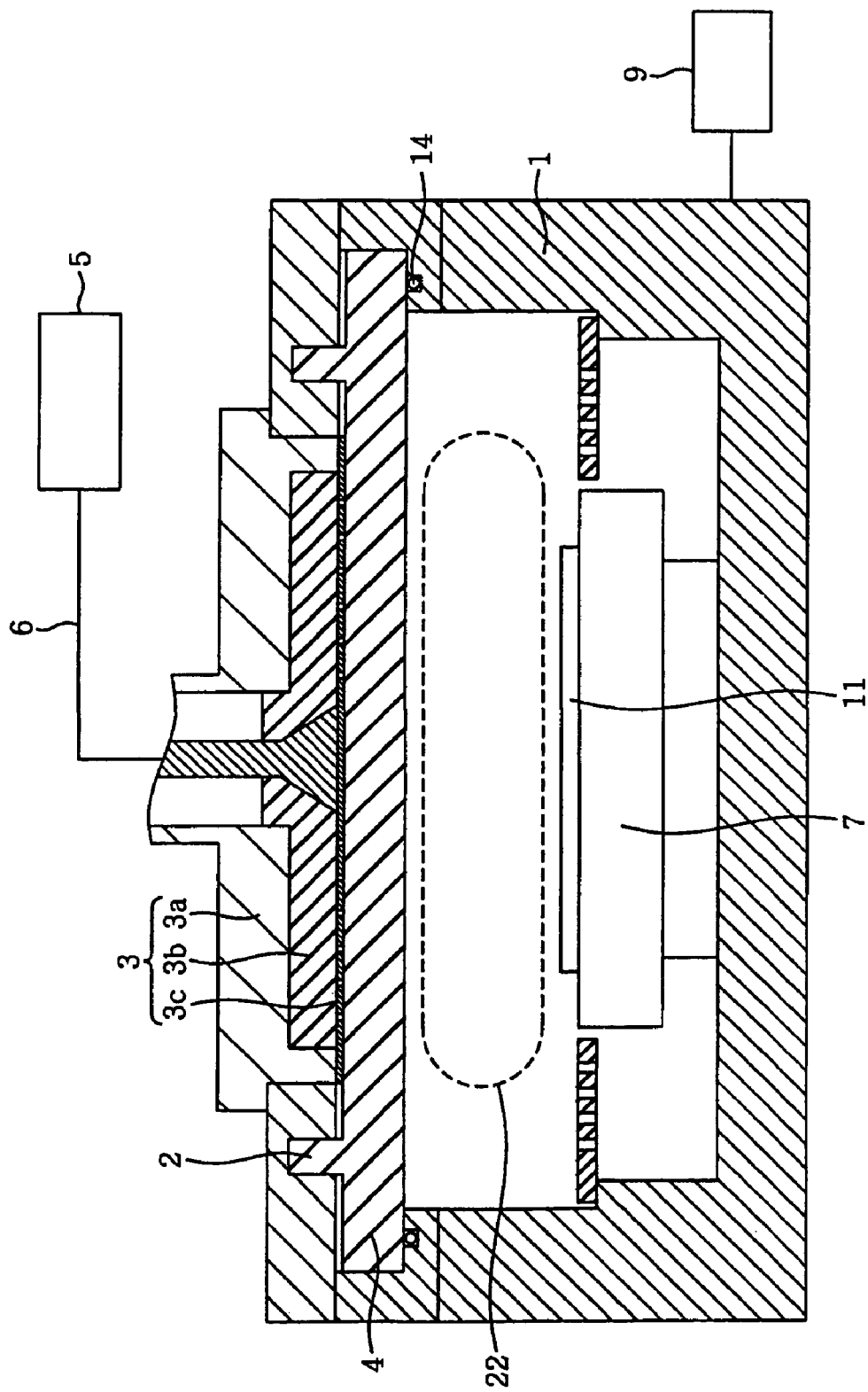
FIG. 1 shows a cross sectional view of a plasma processing device in accordance with a first preferred embodiment of the present invention.

A plasma processing device in accordance with a first preferred embodiment of the present invention will now be described. As shown in FIG. 1, the plasma processing device includes a chamber 1 for accommodating therein a substrate 11 and performing a predetermined process thereon; a high frequency power supply 5 for generating a microwave; and an antenna unit 3 for radiating the microwave into the chamber 1.

The antenna unit 3 is constructed to have a slot plate 3c, a wave delay plate 3b and an antenna cover 3a. The slot plate 3c includes, e.g., a copper plate and the like having a thickness ranging from about 0.1 mm to several millimeters. Provided in the slot plate 3c is a plurality of slots (openings) through which the microwave is radiated into the chamber 1. The microwave generated by the high frequency power supply 5 is propagated through a waveguide 6 to the antenna unit 3.

In the chamber 1, a susceptor 7 for holding the substrate 11 accommodated in the chamber 1 is installed. Further, a vacuum pump 9 for evacuating the chamber 1 is connected to the chamber 1.

Provided at an upper portion of the chamber 1 is a top plate 4 constituting a part of a partition wall of the chamber 1. The top plate 4 is formed of, e.g., a dielectric material such as quartz. Between the top plate 4 and the partition wall of the chamber 1, a sealing member 14 such as, e.g., an O-ring is installed. The antenna unit 3 is disposed above the top plate 4.

The top plate 4 is disposed to face the substrate 11 accommodated and contacts with the slot plate 3c. Provided above an outer peripheral portion of the top plate 4 is a ring-shaped delay pass unit 2 for retarding the propagation of the microwave. In this case, the delay pass unit 2 is formed of the same material as that of the top plate 4.

Furthermore, the contact of the top plate 4 with the slot plate 3c includes a case that there is a clearance between the top plate 4 and the slot plate 3c equal to or less than one tenth of a wavelength of the microwave in atmosphere as well as a case that the top plate 4 tightly contacts with the slot plate 3c.

The reason for limiting the size of the clearance to be equal to or less than one tenth of the wavelength of the microwave is that, if the clearance is greater than one tenth of the wavelength of the microwave, the distribution of the electromagnetic field in the chamber 1 is changed due to the electromagnetic field generated in the clearance.

Hereinafter, a plasma processing by using the plasma processing device mentioned above will be described. First, the chamber 1 is evacuated by the vacuum pump 9 and, e.g., an argon gas is introduced into the chamber 1 as a gas for generating a plasma under a predetermined range of pressure.

Meanwhile, a microwave is generated by the high frequency power source 5. The generated microwave is propagated through the waveguide 6 to the antenna unit 3. The microwave that has reached the antenna unit 3 propagates in the wave delay plate 3b toward the peripheral edge thereof. The microwave propagating in the wave delay plate 3b propagates through the top plate 4 from the slot plate 3c and is then radiated into the chamber 1 to generate an electromagnetic field.

Due to the electromagnetic field generated in the chamber 1, the argon gas is dissociated and a plasma generation region 22 is formed between the substrate 11 and the top plate 4 so that a predetermined plasma processing can be performed on the substrate 11.

In the plasma processing device described above, the delay pass unit 2 is provided in order to delay the microwave propagating through the top plate 4. As described above, the delay pass unit 2 is formed of, e.g., quartz, the same material as that of the top plate 4.

Figure 2:
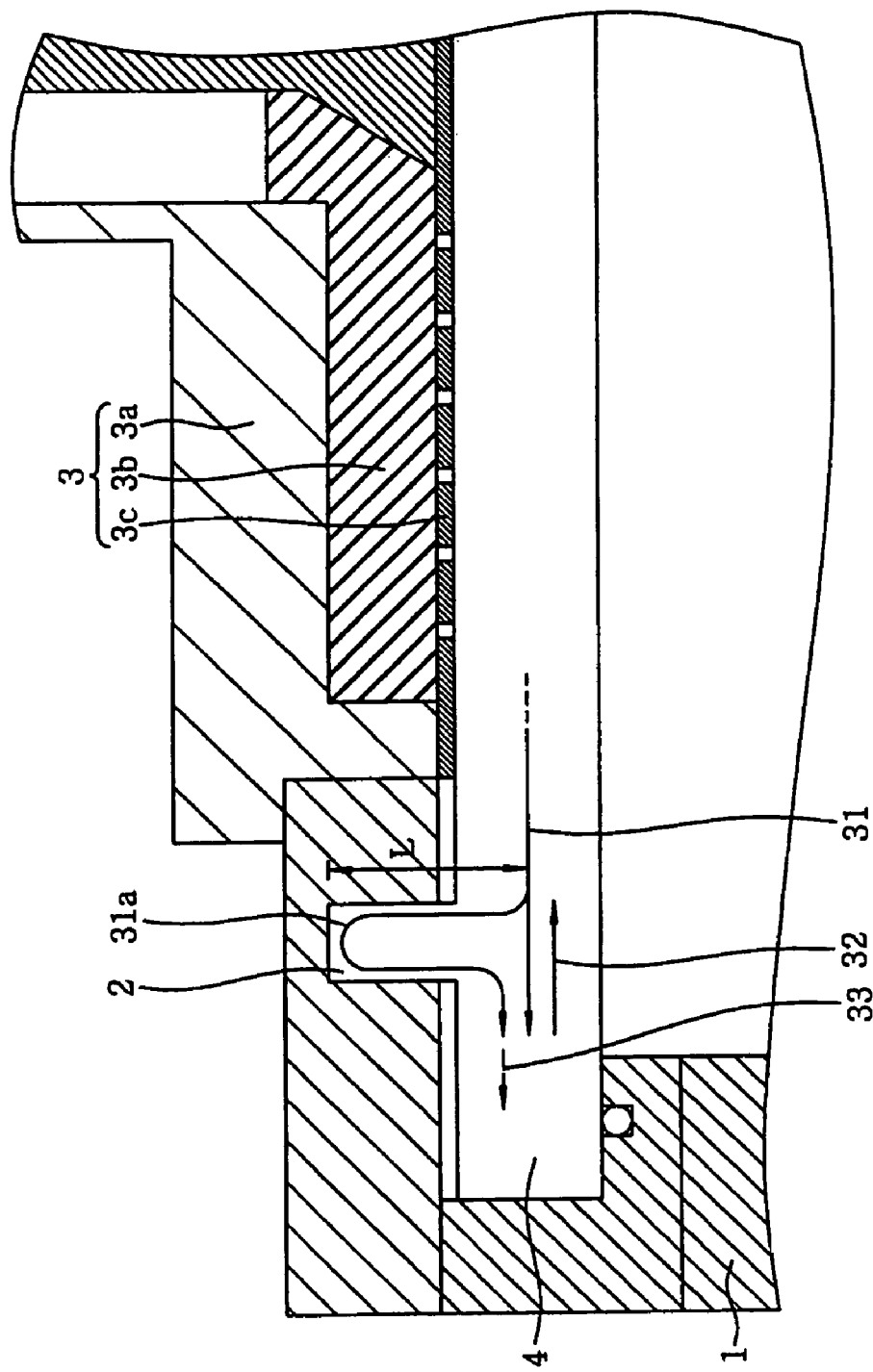
FIG. 2 illustrates a partially enlarged cross sectional view of the plasma processing device depicted in FIG. 1.

As shown in FIG. 2, a part of the microwave propagating in the top plate 4 toward the peripheral edge thereof is branched to propagate through the delay pass unit 2. The microwave 31a that propagates through the delay pass unit 2 is reflected at an end portion of the delay pass unit 2, propagates toward the top plate 4, and then joins (interferes) with the microwave 31 which is not branched.

In this case, where a wavelength of the microwaves 31 and 31a, respectively propagating through the top plate 4 and the delay pass unit 2, is λ and a distance between an approximately central position in the thickness direction of the top plate 4 and the end portion of the delay pass unit 2 is L, the distance L is set as, e.g., a length corresponding to λ/4. Therefore, while the microwave 31a goes and returns through the delay pass unit 2, the microwave 31a travels over a distance corresponding to λ/2.

Further, when respective dielectric constants of the top plate 4 and the delay pass unit 2 are both $\in r_A$ and a wavelength of the microwave under a vacuum state is $\lambda_0$, the wavelength λ of the microwave 31 which is same as that of the microwave 31a is calculated by an equation $\lambda = \lambda_0 * (\in r_A)^{-1/2}$.

Accordingly, at a location where the branched microwave 31a joins with the non-branched microwave 31, the microwave 31a is out of phase by λ/2 from that of the microwave 31 so that the microwave 31a and the microwave 31 counteract each other.

Since the microwave 31a and the microwave 31 counteract each other, an intensity of a microwave 33 that further propagates through the top plate 4 toward the outer peripheral portion thereof is significantly weakened.

More specifically, the microwave 31 propagating through the top plate 4 toward the peripheral portion thereof interferes with the microwave 31a which has propagated and come through the delay pass unit 2 so that most of the components of the microwave 31 is reflected to propagate as a microwave 32 through the top plate 4 along a direction opposite to the direction of the microwave 31 forwarded in the top plate 4. As a result, the components of the microwave 33 that further propagates through the top plate 4 toward the peripheral portion thereof is significantly decreased.

As described above, due to the significant decrease in the microwave 33 that further propagates through the top plate 4 beyond the delay pass unit 2 toward the peripheral portion thereof, it is possible to suppress an occurrence of a strong electric field at a location adjacent to the peripheral portion of the top plate 4 where the top plate 4 contacts with the chamber 1. As a result, since the occurrence of an abnormal discharge and production of foreign materials can be suppressed, a stable plasma processing can be performed on the substrate 11.

The phase difference λ/2 is understood to include an error of about λ/10. It is believed that the counteraction effect of microwave is reduced if the phase difference becomes greater than the above range.

In the plasma processing device described above, although there has been described as an example the delay pass unit 2 formed of the same material as that of the top plate 4, the delay pass unit 2 is not limited thereto.

That is, the delay pass unit 2 may be formed of a material with a dielectric constant different from that of the top plate 4, or may be formed of a space. It is sufficient as long as the delay pass unit 2 is constructed to have a material and dimensional relationship such that the phase of the microwave 31a is shifted by $\lambda/2$ from that of the microwave 31 at a location where the microwave 31a that has propagated through the delay pass unit 2 interferes with the microwave 31 that did not propagate through the delay pass unit 2.

Further, as the delay pass unit, separate other delay pass units may be provided on the side far from the antenna unit 3 with respect to the delay pass unit 2 shown in FIG. 2. In this case, since most of the components of the microwave 33 that further propagates through the top plate 4 toward the peripheral portion thereof is reflected, it is possible to surely suppress the occurrence of an abnormal discharge and production of foreign materials.

Second Embodiment

Figure 3:
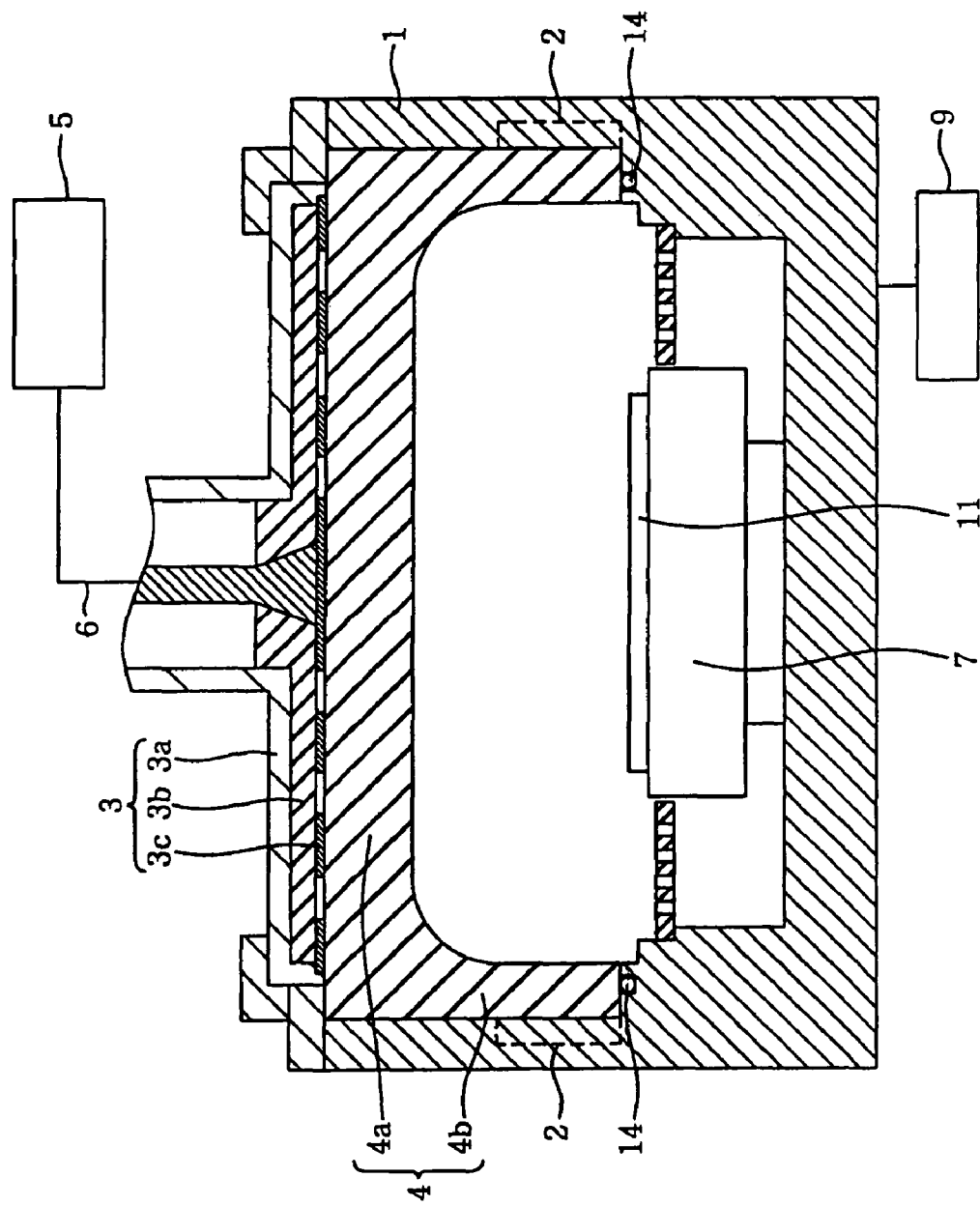
FIG. 3 describes a cross section view of a plasma processing device in accordance with a second preferred embodiment of the present invention.

A plasma processing device in accordance with a second preferred embodiment of the present invention will now be described. As shown in FIG. 3, a top plate 4 constituting a part of the partition wall of a chamber 1 is provided with a flat plate portion 4a and a side wall portion 4b.

The flat plate portion 4a contacts with a slot plate 3c disposed to face a substrate 11 accommodated. The side wall portion 4b is constructed to have a cylindrical shape extending from the peripheral portion of the flat plate portion 4a toward a side on which the substrate 11 is disposed. The outer peripheral surface of the side wall portion 4b contacts with the chamber 1.

The top plate 4 including the flat plate portion 4a and the side wall portion 4b is called a bell jar type of the top plate 4 in comparison with a flat plate type of top plate having only the flat plate portion described previously. By providing the bell jar type of the top plate 4, an area of the top plate 4 facing the plasma generation region is increased compared with the flat plate type of top plate and the microwave is radiated even from the side wall portion 4b into the chamber 1, so that the plasma density in the plasma generation region is further increased.

As described above, in the bell jar type of the top plate 4, since the microwave is radiated even from the side wall portion 4b, it is preferable that a delay pass unit 2 is provided on the side of the side wall portion 4b rather than the side of the flat plate portion 4a of the top plate 4.

Further, as the constitutions other than the above are the same as those of the plasma processing device in accordance with the first preferred embodiment shown in FIG. 1, like parts are represented by like reference numerals and explanation thereof will be omitted.

Next, the plasma processing by using the above-described plasma processing device will be described. A microwave generated by a high frequency power supply 5 is propagated through a waveguide 6 to the antenna 3. The microwave propagates through the top plate 4 from the slot plate 3c and is then radiated into the chamber 1. Due to the microwave radiated in the chamber 1, an electromagnetic wave is generated in the chamber 1 to ionize the argon gas introduced into the chamber 1 so that a plasma generation region is formed between the substrate 11 and the top plate 4.

Figure 4:
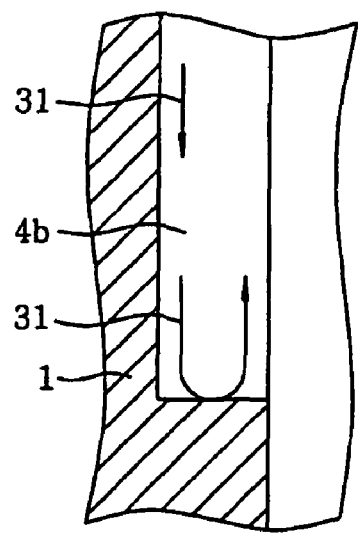
FIG. 4 depicts a first partially enlarged cross sectional view of a portion wherein a high electric field is likely to occur, in the second preferred embodiment.

At this time, the microwave propagating through the top plate 4 propagates through the flat plate portion 4a toward the outer peripheral portion thereof and then propagates through the side wall portion 4b. As shown in FIG. 4, a microwave 31 downwardly propagating through the side wall portion 4b is reflected at a lower end of the side wall portion 4b.

At the lower end of the side wall portion 4b, a part of the microwave 31 is leaked into the chamber 1 as a microwave 31b downwardly from the lower end of the side wall portion 4b so that a strong electric field is generated at a contact portion between the lower end and the chamber 1.

Figure 5:
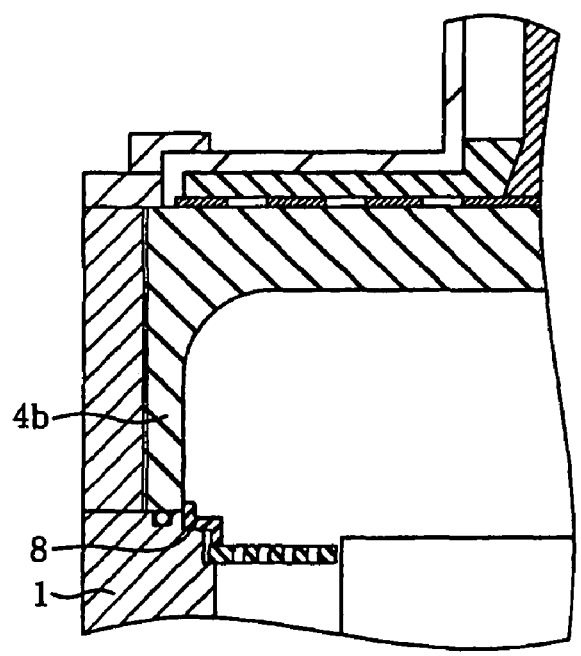
FIG. 5 provides a second partially enlarged cross sectional view of a portion wherein a high electric field is likely to occur, in the second preferred embodiment.
Figure 6:
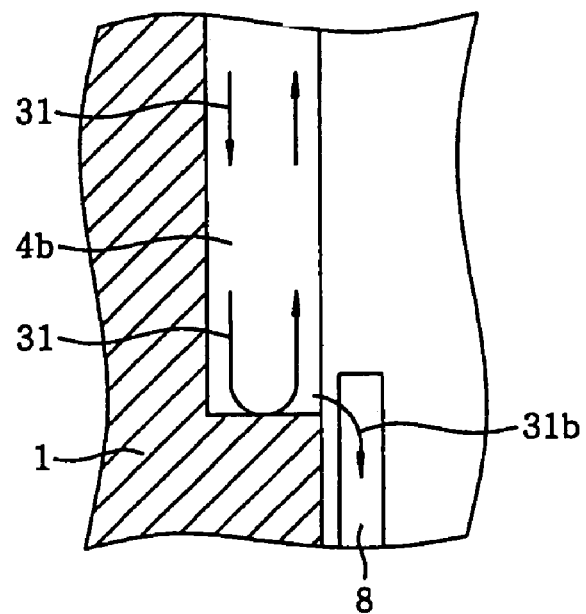
FIG. 6 presents a further enlarged cross sectional view of a portion in FIG. 5.

Further, as shown in FIGS. 5 and 6, in case a liner 8 is provided to cover a metal portion of the chamber 1 located adjacent to the lower end of the side wall portion 4b, the microwave 31b downwardly leaked from the lower end of the side wall portion 4b propagates to the liner 8. Therefore, there may be formed a strong electric field at the contact portion between the lower end of the side wall portion 4b and the liner 8.

Hereinafter, in the plasma processing device having the bell jar type of top plate, a delay pass unit for suppressing such strong electric field will be described in detail.

FIGS. 7 to 11 show more specific structural examples of the delay pass units 2, respectively. In this case, the delay pass units 2 shown in the respective drawings are formed of, e.g., quartz, the same material as that of the top plate 4.

Figure 7:
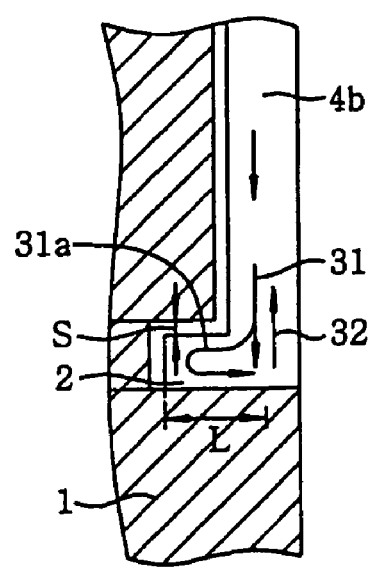
FIG. 7 represents a partially enlarged cross sectional view of a first example of a delay pass unit in the second preferred embodiment.

First, the delay pass unit 2 shown in FIG. 7 is provided at the lower end of the side wall portion 4b. Where the wavelengths of the microwaves 31, 31a propagating through the top plate 4 and the delay pass unit 2, respectively, are both equal to $\lambda$ and a distance between an approximately central position of the top plate in a thickness direction thereof and an end of the delay pass unit 2 is L, the distance L is set as a length corresponding to $\lambda/4$. Further, a clearance S between the side wall portion 4b and the chamber 1 is set as $\lambda/10$.

Figure 8:
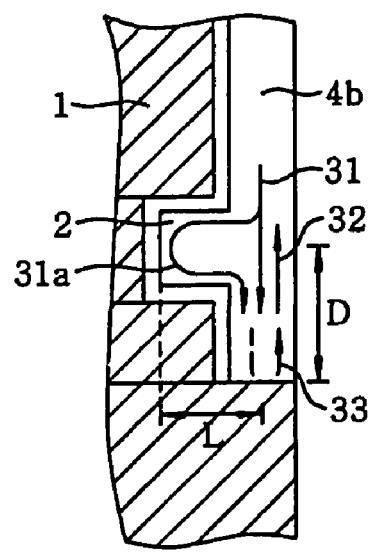
FIG. 8 illustrates a partially enlarged cross sectional view of a second example of the delay pass unit in the second preferred embodiment.

The delay pass unit 2 shown in FIG. 8 is provided at a designated location spaced away upwardly from the lower end of the side wall portion 4b. First, the distance L is set as a length corresponding to $\lambda/4$. Then, where a distance between an approximately central position of the delay pass unit 2 in a vertical thickness direction thereof and the lower end of the side wall portion 4b is D, the distance D is set as a length corresponding to $\lambda/4$.

Figure 9:
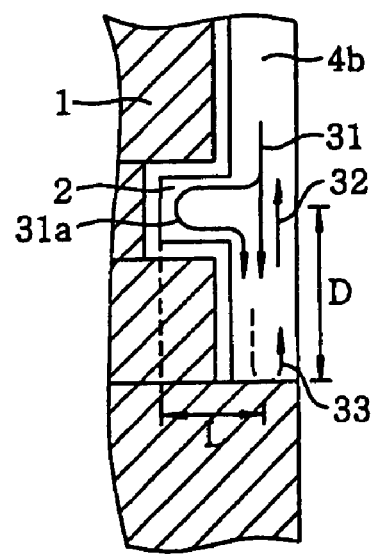
FIG. 9 sets forth a partially enlarged cross sectional view of a third example of the delay pass unit in the second preferred embodiment.

The delay pass unit 2 shown in FIG. 9 is provided at a predetermined location spaced away upwardly from the lower end of the side wall portion 4b. The distance L is set as a length corresponding to $\lambda/4$. The distance D is set as a length corresponding to ($\lambda/4+5$ mm).

Figure 10:
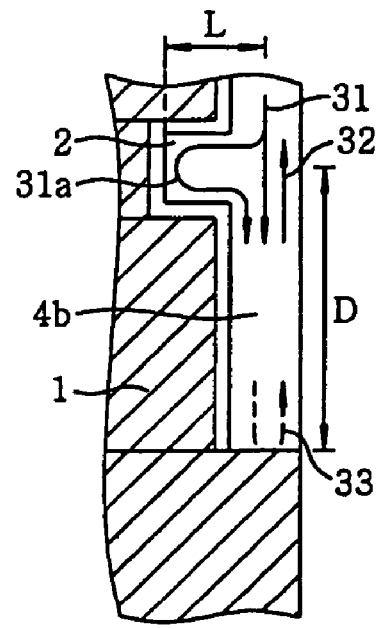
FIG. 10 provides a partially enlarged cross sectional view of a fourth example of the delay pass unit in the second preferred embodiment.

The delay pass unit 2 shown in FIG. 10 is provided at a selected location spaced away upwardly from the lower end of the side wall portion 4b. The distance L is set as a length corresponding to $\lambda/4$. The distance D is set as a length corresponding to $\lambda/2$.

Figure 11:
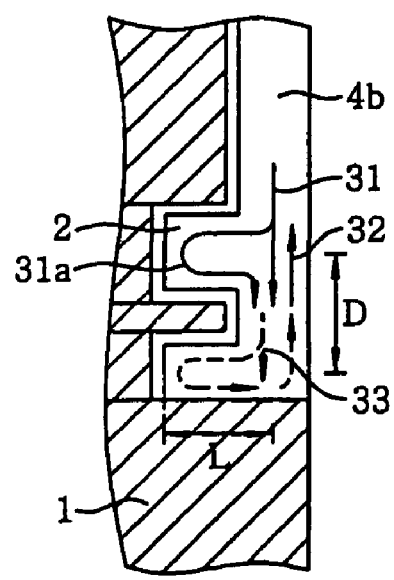
FIG. 11 shows a partially enlarged cross sectional view of a fifth example of the delay pass unit in the second preferred embodiment.

The delay pass unit 2 shown in FIG. 11 is provided at two different locations which are spaced away upwardly from the lower end of the side wall portion 4b. First, in the two delay pass units 2, the distance L is set as a length corresponding to $\lambda/4$. Then, where a distance between an approximately central position of the lower delay pass unit 2 in a vertical thickness direction thereof and an approximately central position of the upper delay pass unit 2 in a vertical thickness direction thereof is D, the distance D is set as a length corresponding to $\lambda/4$.

By providing the delay pass unit 2 described above, as similar to the above-mentioned plasma processing device, a part of the microwave 31 propagating through the side wall portion 4b toward the lower end thereof is branched to propagate through the delay pass unit 2. The microwave 31a propagating through the delay pass unit 2 is reflected at the end thereof and then propagates toward the side wall portion 4b to join (interfere) with the microwave 31 which is not branched.

At the joining location, a phase of the microwave 31a is delayed by λ/2 from that of the microwave 31 so that the microwave 31a and the microwave 31 counteract each other.

In this way, the microwave 31 propagating through the side wall portion 4b is reflected by interfering with the microwave 31a which has returned after propagating through the delay pass unit 2 so that most of the components of the microwave 31 is reflected to propagate through the side wall portion 4b as a microwave 32 toward a direction opposite to the direction of the microwave 31 forwarded in the side wall portion 4b.

As a result, the components of the microwave 33 that further downwardly propagates through the side wall portion 4b is significantly decreased so that a strong electric field is prevented from being generated at the lower end of the side wall portion 4b. Further, the phase difference λ/2 is understood to include an error of about λ/10 and it is believed that the counteraction effect of microwave becomes reduced if the phase difference is greater than the above range.

In order to quantitatively confirm the weakened intensity of the microwave 33, a simulation analysis was performed on the delay pass units 2 shown in FIGS. 7 to 11.

First, an input power was set to be 1 W and it was calculated a power of microwave that is reflected by the delay pass unit 2 to return. Then, a difference between the input power and the power of the microwave returned was set as a leakage power and a leakage rate was calculated by dividing the leakage power by the input power.

Figure 12:
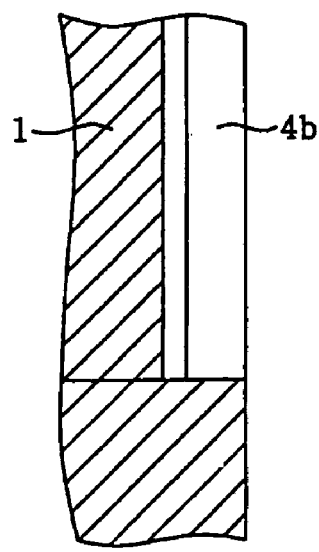
FIG. 12 depicts a partially enlarged cross sectional view of a first structure that becomes a reference of an analysis by simulation, in the second preferred embodiment.
Figure 13:
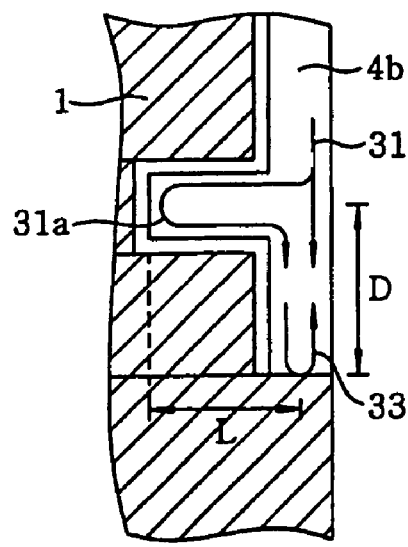
FIG. 13 presents a partially enlarged cross sectional view of a second structure that becomes a reference of an analysis by simulation, in the second preferred embodiment.
Figures 14, 15:
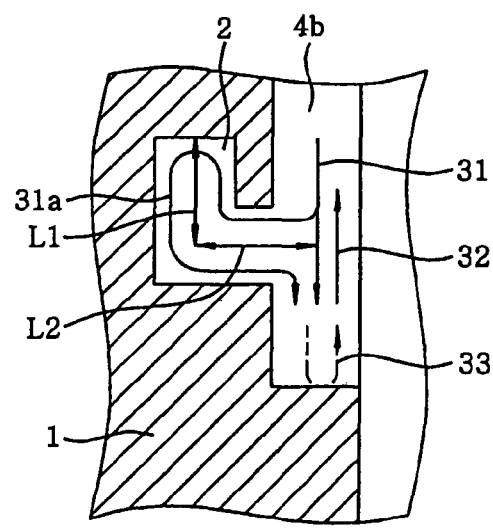
FIG. 14 describes a view showing an analysis result by simulation in the second preferred embodiment.
FIG. 15 represents a partially enlarged cross sectional view of a sixth example of the delay pass unit in the second preferred embodiment.
Figure 16:
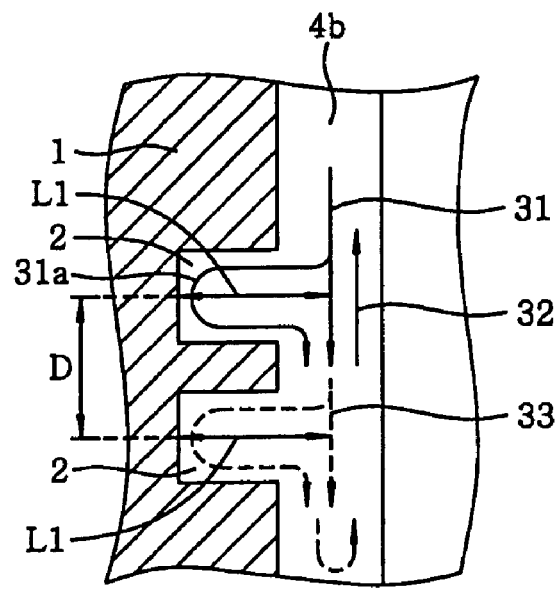
FIG. 16 illustrates a partially enlarged cross sectional view of a seventh example of the delay pass unit in the second preferred embodiment.

The results are indicated in FIG. 14. Further, for the comparison purpose, FIG. 14 also indicates the results of the same simulation analyses on a case (Z1) wherein there is no delay pass unit as shown in FIG. 12 and a case (Z2) wherein the distance L of the delay pass unit is set as a length corresponding to λ/2.

In the cases A to E (FIGS. 7 to 11), since the delay pass unit 2 is provided, it has been proved that the leakage rate is significantly decreased in comparison with the case Z1 (FIG. 12) wherein no delay pass unit 2 is provided.

Further, in the cases B to D wherein the delay pass unit is disposed spaced away from the lower end of the side wall portion 4b, it has been proved that the electric field at the lower end is alleviated and the leakage rate is further decreased in comparison with the case A wherein the delay pass unit 2 is disposed at the lower end of the side wall portion 2. In addition, in the case E wherein two delay pass units 2 are provided, it has been proved that the leakage rate is most effectively decreased.

Moreover, in the case Z2, since the distance L of the delay pass unit 2 is set as a length corresponding to λ/2, the phase of the microwave 31a that was branched to propagate through the delay pass unit 2 becomes the same as that of the microwave 31 that is not branched and propagates through the side wall portion 4b.

As a result, since the microwave 31 propagating through the side wall portion 4b comes to propagate through the side wall portion 4b without being counteracted, it has been proved that the leakage rate is hardly decreased.

Hereinafter, examples of the delay pass unit other than the above-mentioned delay pass units are shown in FIGS. 15 to 20, respectively, and the dimensional relationships of the respective corresponding delay pass units are indicated in FIG. 21.

First, in the delay pass unit shown in FIG. 15, a distance (L1+L2) along which the branched microwave 31a propagates is set as a length corresponding to λ/4. In the delay pass unit 2 shown in FIG. 16, two delay pass units are provided and the distance L1 of each delay pass unit is set as a length corresponding to λ/4 and the distance D is set as a length corresponding to λ/4.

Figure 17:
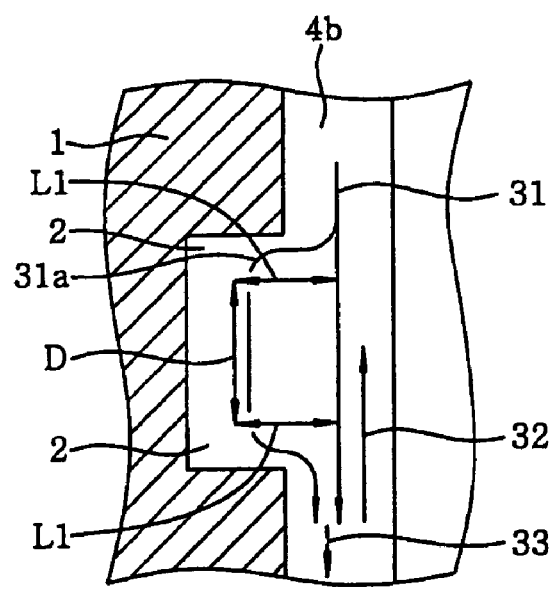
FIG. 17 sets forth a partially enlarged cross sectional view of an eighth example of the delay pass unit in the second preferred embodiment.
Figure 18:
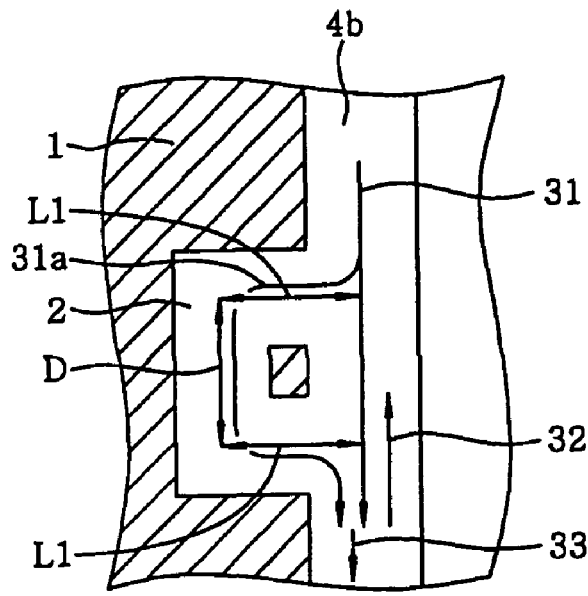
FIG. 18 provides a partially enlarged cross sectional view of a ninth example of the delay pass unit in the second preferred embodiment.

In the delay pass units 2 respectively shown in FIGS. 17 and 18, the distance L1 is set as a length corresponding to λ/4 and the distance D is set as a length corresponding to λ/4 or 3λ/4.

Figure 19:
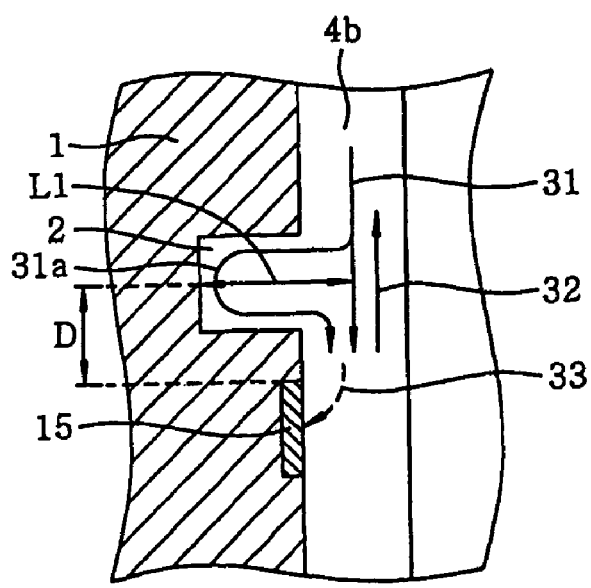
FIG. 19 shows a partially enlarged cross sectional view of a tenth example of the delay pass unit in the second preferred embodiment.
Figure 22:
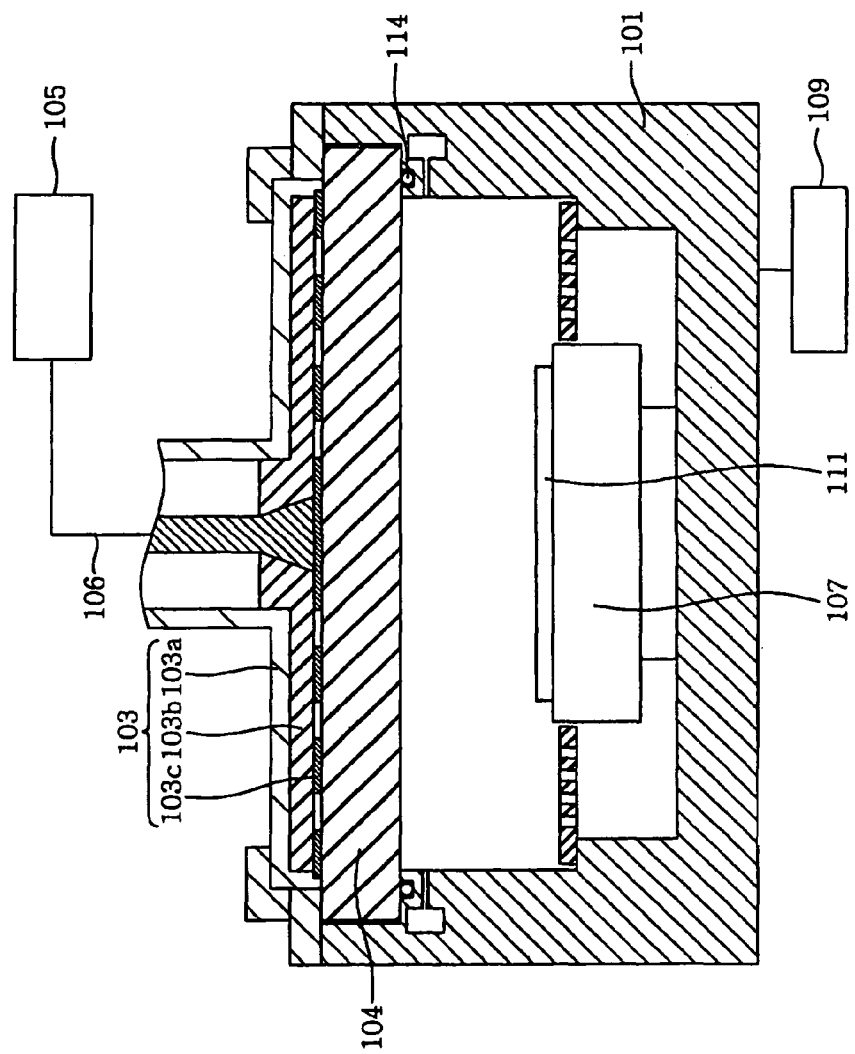
FIG. 22 shows a cross sectional view of a conventional plasma processing device.
Figure 23:
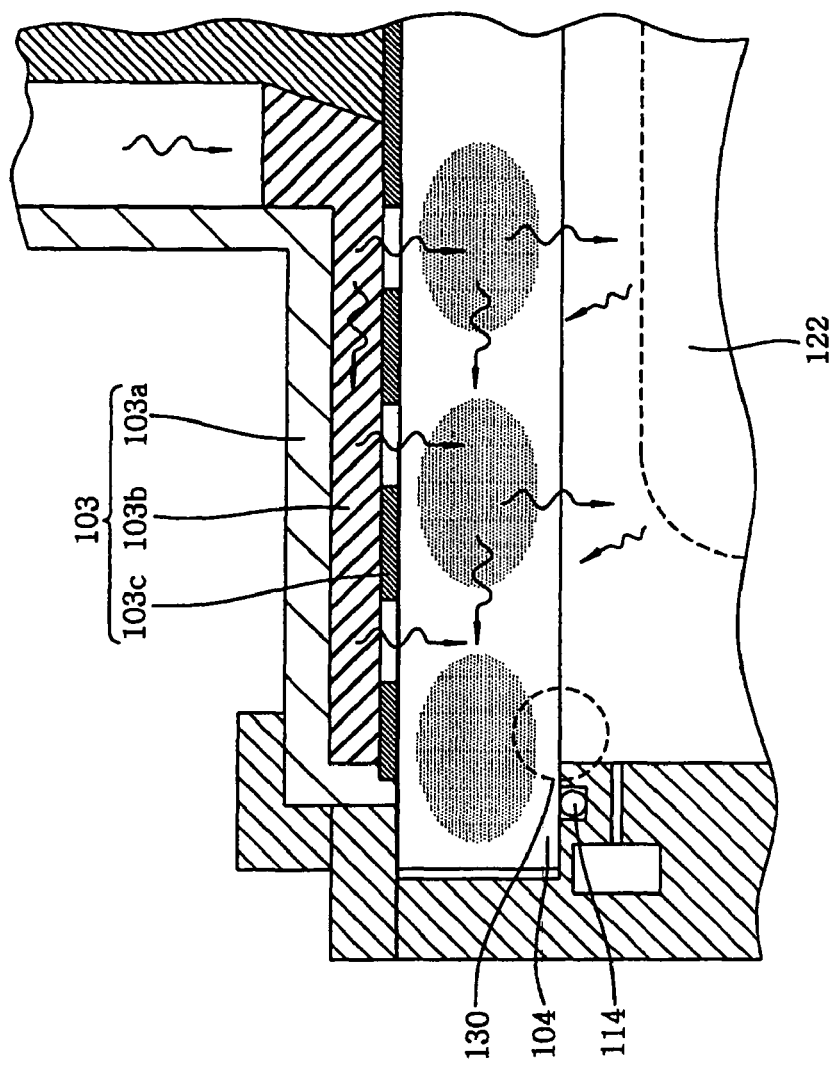
FIG. 23 is a partially enlarged cross sectional view of the plasma processing device shown in FIG. 22.

In the delay pass unit 2 shown in FIG. 19, the distance L1 is set as a length corresponding to λ/4. In order to absorb the microwave, an electric wave absorber 15 such as, e.g., ferrite is provided to the inside wall of the chamber 1 under the delay pass unit 2. It is preferable that a distance D between the delay pass unit 2 and the electric wave absorber 15 is set as a length corresponding to λ/4; however, the present invention is not limited thereto.

The delay pass unit 2 shown in FIG. 20 is formed of a material with a dielectric constant different from that of the side wall portion 4b. Where dielectric constants of the side wall portion 4b and the delay pass unit 2 are $\in r_A$ and $\in r_B$, respectively, a distance that the branched microwave 31a propagates through the delay pass unit 2 is (L1+L2), a distance that the branched microwave propagates through the side wall portion 4b is L3 and a wavelength of the microwave under a vacuum state is $\lambda_0$, they are set to satisfy the relationship of $(L1+L2)/(\lambda_0*(\in r_B)^{-1/2})+L3/(\lambda_0*(\in r_A)^{-1/2})=1/4$.

Even in the plasma processing device including such a delay pass unit 2, at the location where the branched microwave 31a joins with the non-branched microwave 31, the phase of the microwave 31a is delayed by λ/2 from that of the microwave 31 and the microwave 31a and the microwave 31 counteract each other so that most of the components of the microwave 31 is reflected and propagates as a microwave 32 through the side wall portion 4b along a direction opposite to the direction of the forwarding microwave 31 in the side wall portion 4b.

As a result, the components of the microwave 33 that further propagates downwardly through the side wall portion 4b are significantly reduced so that it is possible to suppress the occurrence of an abnormal discharge and the production of foreign materials to perform a stable plasma processing on the substrate 11.

Further, compared with the delay pass unit formed of a mere space, by forming the delay pass unit with a material having a predetermined dielectric constant, the size of the delay pass unit can be reduced, thereby suppressing the increase in size of the plasma processing device due to the presence of the delay pass unit.

It should be understood that the disclosed preferred embodiments have been described as examples only and are not limitative. The present invention is defined by not the above description but the claims, and is intended to include all modifications within the scope of the claims and equivalents thereof.

INDUSTRIAL APPLICABILITY

The present invention is effectively used as a structure for suppressing an occurrence of an abnormal discharge and a production of foreign materials in a plasma processing device for performing a predetermined plasma process, e.g., an etching process or a film forming process, on a substrate by using a plasma generation region formed by introducing a microwave into a chamber.

What is claimed is:

1. A plasma processing device for performing a process on a substrate by subjecting the substrate to be exposed to a plasma generation region, the device comprising:

a chamber for accommodating therein the substrate;

a dielectric top plate being a part of a partition wall of the chamber;

an antenna unit comprising a slot antenna, for supplying a high frequency electromagnetic field through the top plate into the chamber to form the plasma generation region between the top plate and the substrate accommodated in the chamber; and a ring-shaped dielectric delay pass unit for branching the high frequency electromagnetic field propagating through the top plate, wherein when the branched high frequency electromagnetic field again joins with the high frequency electromagnetic field that propagates through the top plate without being branched, the delay pass unit shifts a phase of the branched high frequency electromagnetic field by an odd multiple of $\lambda/2$ compared with that of the high frequency electromagnetic field that propagates through the top plate without being branched to decrease the electromagnetic field at a location near a peripheral end of the top plate, where $\lambda$ is a wavelength of the high frequency electromagnetic field propagating through the top plate, and wherein the delay pass unit is protruded from the top plate in a direction perpendicular to a propagating direction of the high frequency electromagnetic field that propagates through the top plate without being branched and the delay pass unit does not contact the plasma generation region, and wherein the delay pass unit is disposed beyond the periphery of the slot antenna.

2. The plasma processing device of claim 1, wherein the top plate includes:

a flat plate portion disposed to face the substrate accommodated; and a cylindrical shaped side wall portion extending from a peripheral portion of the flat plate portion toward a side on which the substrate is disposed, and wherein the delay pass unit is disposed on the side of the side wall portion.

3. The plasma processing device of claim 2, wherein the delay pass unit is disposed in a ring shape along an outer peripheral surface of the side wall portion.

4. The plasma processing device of claim 2, wherein the distance between a central position in the thickness direction of the top plate and an end of the delay pass unit is $\lambda/4$.

5. The plasma processing device of claim 1, wherein the delay pass unit includes a first and a second portion located at an upstream and a downstream side, respectively, in terms of a forward direction of the high frequency electromagnetic field propagating through the top plate.

6. The plasma processing device of claim 5, wherein the distance between a central position in the thickness direction of the top plate and an end of the delay pass unit is $\lambda/4$.

7. The plasma processing device of claim 1, wherein the delay pass unit has a propagation area, communicating with the top plate, for propagating the branched high frequency electromagnetic field.

8. The plasma processing device of claim 7, wherein the delay pass unit has, as the propagation area, a portion through which the branched high frequency electromagnetic field propagates approximately parallel to the high frequency electromagnetic field propagating through the top plate without being branched.

9. The plasma processing device of claim 7, wherein the propagation area is filled with a member having a predetermined dielectric constant.

10. The plasma processing device of claim 7, wherein the distance between a central position in the thickness direction of the top plate and an end of the delay pass unit is $\lambda/4$.

11. The plasma processing device of claim 1, further comprising an electric wave absorber for absorbing the high frequency electromagnetic field, the electric wave absorber being disposed on the side far from the antenna unit with respect to the delay pass unit.

12. The plasma processing device of claim 1, wherein the delay pass unit is disposed in the vicinity of a peripheral portion of the top plate.

13. The plasma processing device of claim 1, wherein the distance between a central position in the thickness direction of the top plate and an end of the delay pass unit is $\lambda/4$.

* * * * *

UNITED STATES PATENT AND TRADEMARK OFFICE
CERTIFICATE OF CORRECTION

PATENT NO. : 7,828,927 B2
APPLICATION NO. : 11/060558
DATED : November 9, 2010
INVENTOR(S) : Kiyotaka Ishibashi et al.

It is certified that error appears in the above-identified patent and that said Letters Patent is hereby corrected as shown below:

Column 11, line 16, change "an odd multiple of $\lambda_,/2$" to --an odd multiple of $\lambda/2$--

Signed and Sealed this
Fifteenth Day of February, 2011

David J. Kappos
*Director of the United States Patent and Trademark Office*